US011523536B2

(12) United States Patent
Wiederhold et al.

(10) Patent No.: US 11,523,536 B2
(45) Date of Patent: Dec. 6, 2022

(54) RACK MOUNTED EQUIPMENT WITH REAR POST MOUNTED AIR FILTER PANELS

(71) Applicant: DELL PRODUCTS, L.P., Round Rock, TX (US)

(72) Inventors: Trey S. Wiederhold, Cedar Park, TX (US); Gerald P. Courtney, Austin, TX (US); Anthony P. Middleton, Cedar Park, TX (US)

(73) Assignee: Dell Products, L.P., Round Rock, TX (US)

( * ) Notice: Subject to any disclaimer, the term of this patent is extended or adjusted under 35 U.S.C. 154(b) by 335 days.

(21) Appl. No.: 16/724,040

(22) Filed: Dec. 20, 2019

(65) Prior Publication Data

US 2021/0195791 A1 Jun. 24, 2021

(51) Int. Cl.
*B01D 46/00* (2022.01)
*B01D 46/12* (2022.01)
*B01D 46/58* (2022.01)
*H05K 7/20* (2006.01)

(52) U.S. Cl.
CPC ....... *H05K 7/20181* (2013.01); *B01D 46/001* (2013.01); *B01D 46/0005* (2013.01); *B01D 46/12* (2013.01); *B01D 46/58* (2022.01); *H05K 7/20736* (2013.01); *B01D 2265/02* (2013.01); *B01D 2279/45* (2013.01)

(58) Field of Classification Search
CPC .. B01D 46/0005; B01D 46/001; B01D 46/12; B01D 46/58; B01D 2279/45; H05K 7/20181; H05K 7/20736

USPC ............. 55/385.6, 471, 473; 312/213, 223.1, 312/223.3, 223.6; 361/685; 454/184
See application file for complete search history.

(56) References Cited

U.S. PATENT DOCUMENTS

| | | | | |
|---|---|---|---|---|
| 5,163,870 A * | 11/1992 | Cooper | ................... | G06F 1/181 55/467 |
| 5,863,310 A * | 1/1999 | Brown | ................... | B01D 46/88 55/DIG. 35 |
| 5,968,217 A * | 10/1999 | Stein | ...................... | B01D 46/10 55/DIG. 35 |
| 6,030,427 A * | 2/2000 | Sorice | .................... | B01D 46/10 55/DIG. 35 |
| 6,284,010 B1* | 9/2001 | Rehmert | ............ | B01D 46/0002 55/385.6 |
| 6,533,835 B2* | 3/2003 | Wilson | ................... | B01D 46/10 55/482 |
| 6,648,947 B2* | 11/2003 | Paydar | .................. | B01D 46/62 95/286 |
| 6,746,502 B2 | 6/2004 | Yair et al. | | |

(Continued)

*Primary Examiner* — Minh Chau T Pham
(74) *Attorney, Agent, or Firm* — Isidore PLLC

(57) ABSTRACT

An air filtration panel is used in an information handling system (IHS) rack within a modular data center. The air filtration panel includes an air filter and a filter frame. The filter frame has a lateral width at least as wide as a transverse opening in a four-post rack. The four-post rack has left and right flanges respectively coupled to a pair of posts of the four-post rack. Each of the left and right flanges has vertically aligned holes. The filter frame includes a channel that receives and contains an outer edge of the air filter. The filter frame left and right surfaces each having fastener throughholes spaced to align with and mount to respective holes in the corresponding one of the left and right flanges of the four-post rack.

20 Claims, 11 Drawing Sheets

(56) References Cited

U.S. PATENT DOCUMENTS

| | | | | |
|---|---|---|---|---|
| 7,803,206 | B2* | 9/2010 | Tracy | B01D 46/0002 55/385.6 |
| 8,157,882 | B2* | 4/2012 | Curtis | F25D 17/042 55/497 |
| 8,580,007 | B2* | 11/2013 | Gruber | G02B 6/4452 55/504 |
| 8,591,625 | B2 | 11/2013 | Iyengar et al. | |
| 9,320,177 | B2 | 4/2016 | Levesque | |
| 10,076,719 | B2 | 9/2018 | Zhang et al. | |
| 2002/0027765 | A1* | 3/2002 | Negishi | H05K 7/20581 55/385.6 |
| 2003/0079449 | A1* | 5/2003 | Jones | B01D 46/10 55/385.6 |
| 2007/0283672 | A1* | 12/2007 | Fu | G06F 1/20 55/385.6 |
| 2008/0045135 | A1* | 2/2008 | Pfannenberg | F24F 1/0071 454/184 |
| 2008/0160898 | A1* | 7/2008 | Pfannenberg | F04D 29/547 454/184 |
| 2008/0236393 | A1* | 10/2008 | Heller | B01D 46/0005 29/422 |
| 2010/0015904 | A1* | 1/2010 | Yeh | B01D 46/0005 55/511 |
| 2013/0114191 | A1* | 5/2013 | Fuchu | B42D 17/00 361/679.01 |

\* cited by examiner

RACK MOUNTED EQUIPMENT WITH REAR POST MOUNTED AIR FILTER PANELS

BACKGROUND

1. Technical Field

The present disclosure generally relates to air cooling of rack mounted equipment, and in particular to air cooling of rack mounted equipment with air quality consideration.

2. Description of the Related Art

As the value and use of information continue to increase, individuals and businesses seek additional ways to process and store information. One option available to users is information handling systems. An information handling system generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems can include one or more of information technology (IT), operation technology (OP), and network components that generate heat as a byproduct during use. An economical way to remove the generated heat is forced air cooling that absorbs and removes the generated heat by convection. To achieve greater density of components, information handling systems are mounted in one or more racks that have a front side exposed to a cold aisle and a back side exposed to a hot aisle. Differential air pressure between the cold and hot aisles causes air cooling to pass through the rack information handling system (RIHS). A cooling system conditions the air for RIHSs. The conditioning can include adjusting the air temperature and/or humidity and circulating the conditioned cooling air through a volumetric container that houses the RIHSs. Modular data centers (MDCs) include small volumetric containers that house a small number of RIHSs. Micro-MDCs, for example, house only one or two RIHSs in very small volumetric containers. Micro-MDCs can be placed in austere locations that have prevalent environmental contaminants such as dust and salt. Opening an access door to the micro-MDC exposes the RIHSs to these contaminants.

BRIEF SUMMARY

Disclosed are an air filtration panel, a modular data center (MDC), and a method for protecting air cooled components from particulate and gaseous contaminates.

According to one embodiment, an air filtration panel for use in an information handling system (IHS) rack is provided. The air filtration panel includes an air filter and a filter frame having a lateral width at least as wide as a transverse opening in a four-post rack. The four-post rack has left and right flanges respectively coupled to a pair of posts of the four-post rack. Each of the left and right flanges has vertically aligned holes. The filter frame includes a channel that receives and contains an outer edge of the air filter. The filter frame includes left and right surfaces each having fastener through-holes spaced to align with and mount to respective holes in the corresponding one of the left and right flanges of the four-post rack.

According to a next embodiment, a data center includes a volumetric container having a cold aisle and a hot aisle and having an access door that opens to expose the interior to outside air. At least one four-post rack is received in the volumetric container between the cold aisle and the hot aisle. The four-post rack has a rack frame with a front pair of vertical posts and a back pair of vertical posts. The front pair of vertical posts is positioned adjacent to the cold aisle and the back pair of vertical posts is positioned adjacent to the hot aisle. Each pair of vertical posts has left and right flanges respectively with more than one hole. A cooling system of the MDC directs supply air to the cold aisle and receives return air from the hot aisle. At least one heat generating component is positioned in the at least one four-post rack and receives supply air that is warmed by convection to become the return air. A first air filtration panel of the MDC includes an air filter and a filter frame that has a lateral width at least as wide as a transverse opening in the four-post rack. The filter frame includes an inwardly open channel that receives and contains outer edges of the air filter. The filter frame includes left and right surfaces, each having fastener through-holes that are spaced to align with and mount to respective holes in the corresponding one of the left and right flanges of the four-post rack.

According to another embodiment, a method of protecting information technology (IT) equipment from contaminated outside air is provided. The method includes inserting an outer edge of an air filter in a channel of a filter frame that receives and contains an outer edge of the air filter to provide an air filtration panel, the filter frame having fastener through-holes in left and right surfaces. The method includes positioning the filter frame to cover a lateral width of an opening in a four-post rack to align the fastener through-holes in left and right surfaces of the filter frame with holes in left and right flanges respectively coupled to a pair of posts of the four-post rack. The method includes engaging two or more fasteners through selected through-holes in the filter frame and the respective holes in the corresponding one of the left and right flanges of the four-post rack.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1A:
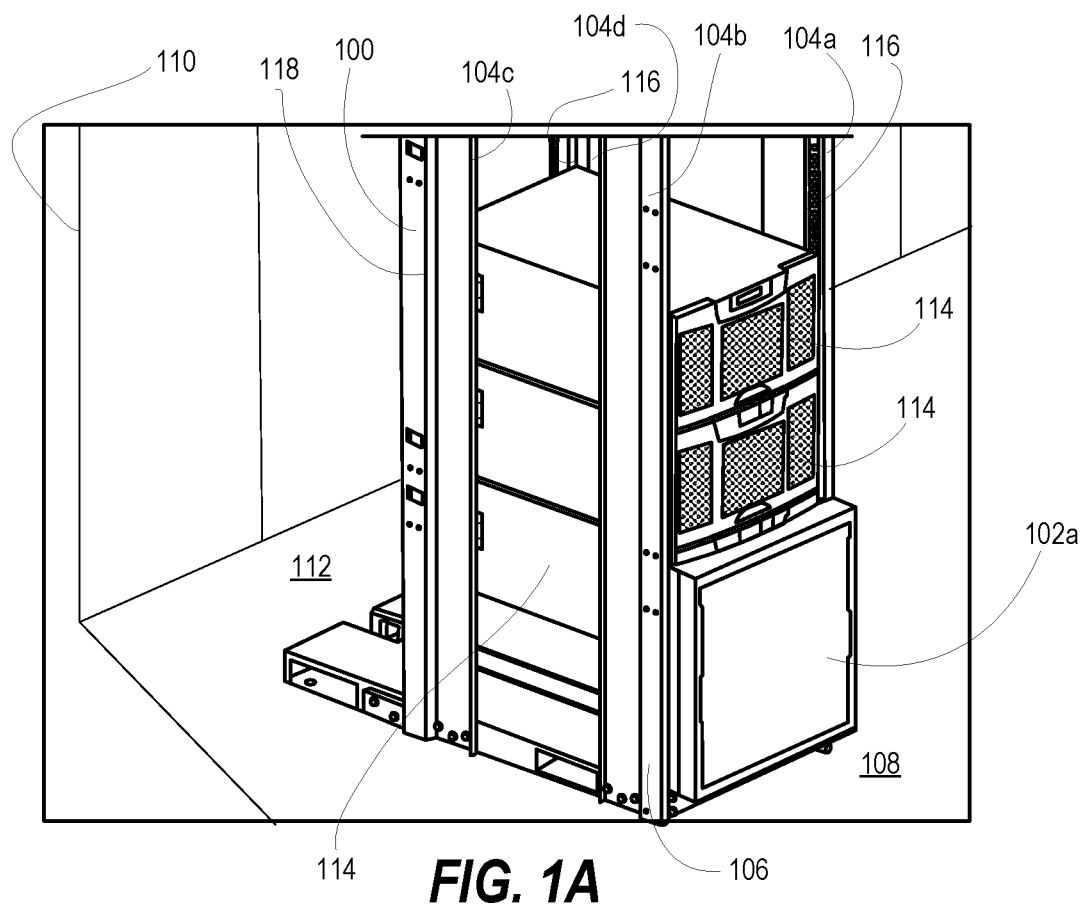
FIG. 1A is a three-dimensional view of a rack information handling system (RIHS) having an example air filtration panel attached to rear posts of a rack, according to one or more embodiments.

The illustrative embodiments provide an air filtration panel, a modular data center (MDC), and method for protecting air cooled components from particulate and gaseous contaminates. The air filtration panel is used in an information handling system (IHS) rack within the MDC. The air filtration panel includes an air filter and a filter frame. The filter frame has a lateral width at least as wide as a transverse opening in a four-post rack. The four-post rack has left and right flanges respectively coupled to a pair of posts of the four-post rack. Each of the left and right flanges has vertically aligned holes. The filter frame includes a channel that receives and contains an outer edge of the air filter. The filter frame left and right surfaces each having fastener throughholes spaced to align with and mount to respective holes in the corresponding one of the left and right flanges of the four-post rack.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized, and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that term is utilized.

FIG. 1A depicts a three-dimensional view of a rack information handling system (RIHS) 100 having example air filtration panel 102a attached to rear posts 104a-104b of rack 106. As described in greater detail later with reference to FIGS. 6-8, air filtration panel 102a and rear posts 104a-104b are positioned along cold aisle 108 within enclosure 110 of an MDC. Front posts 104c-104d are positioned along hot aisle 112 within enclosure 110. In one or more embodiments, RIHS 100 is rack-mounted to provide computing, communication and storage functionality in enclosure 110 provided by a data center, modular data center (MDC) or large vehicle. Within the general context of information handling systems (IHSs), RIHS 100 may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, RIHS 100 may be a server, blade server, rack-mounted server, rack-mounted data storage, or other rack-mounted IT equipment. Operation technology (OT) equipment can be included, such as components that provide infrastructure support of cooling, power distribution, fire suppression, or security. RIHS 100 may include random access memory (RAM), one or more processing resources such as a central processing unit (CPU) or hardware or software control logic, read only memory (ROM), and/or other types of nonvolatile memory. Additional components of the RIHS 100 may include one or more disk drives, one or more network ports for communicating with external devices as well as various input and output (I/O) devices, such as a keyboard, a mouse, and a video display. The RIHS 100 may also include one or more buses operable to transmit communications between the various hardware components.

Figure 1B:
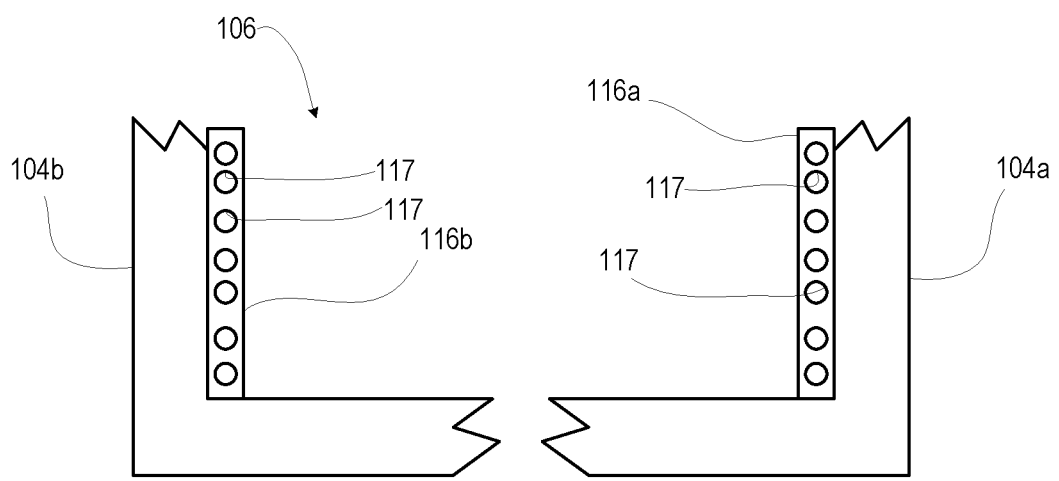
FIG. 1B is an enlarged front view of the rack of FIG. 1A having flanges for attaching equipment, according to one or more embodiments.

FIG. 1B depicts an enlarged front view of example rack 106 of RIHS 100 (FIG. 1A) having right and left vertical flanges 116a-116b attached respectively to rear posts 104a-104b for attaching equipment such as air filtration panels 102a (FIG. 1A). Right and left vertical flanges 116a-116b include mounting holes 117. Rack 106 can be of different widths and heights. In one or more embodiments, rack 106 is constructed according to EIA-310 specification, which is often called a "standard rack". EIA stands for the Electronic Industries Association. This specification standardizes several important features of 19" racks, such as the Rack Unit (RU or U), vertical hole spacing, horizontal hole spacing, rack opening and front panel width. The specification also sets tolerances on each of these dimensions. With particular reference to FIG. 1A, the 19 inch dimension includes the edges or "ears" that protrude from each side of equipment module 114, allowing equipment module 114 to be fastened with screws to vertical flanges 116a-116b that respectively extend from rear posts 104a-104b and front posts 104c-104d of rack frame 118. Common uses of the standard rack include computer servers, telecommunications equipment and networking hardware, audiovisual production and scientific equipment. Four-post rack 106 allows for mounting rails to support external equipment at the front and rear, such as air filtration panel 102a of the present disclosure.

Figure 1C:
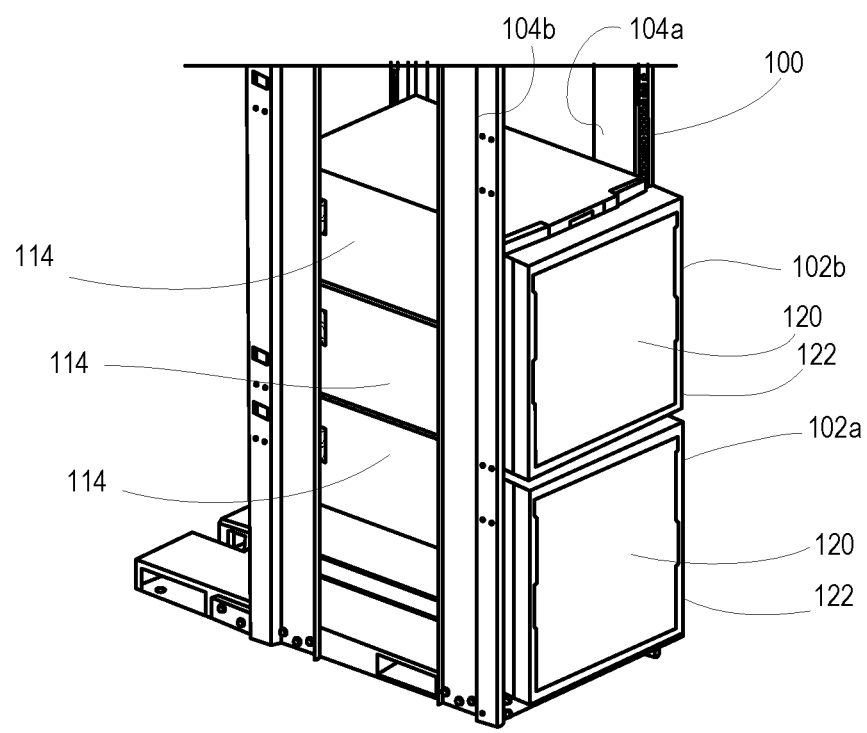
FIG. 1C is a three-dimensional view of the RIHS of FIG. 1A with a second air filtration panel attached above the first air filtration panel, according to one or more embodiments.

FIG. 1C depicts a three-dimensional view of RIHS 100 with second air filtration panel 102b attached above first air filtration panel 102a on rear posts 104a-104b. Additional air filtration panels can be attached to protect all of the transverse openings in rack 106. Air filters 120 in filter frames 122 of first and second air filtration panels 102a-102b can entrap particulate and/or gaseous contaminants, preventing these contaminants from causing damage to equipment modules 114. Air filtration panels 102a-102b can augment filtration that is present in enclosure 110 and/or in equipment modules 114 and/or cooling systems (not shown) attached to the enclosure.

Figure 2A:
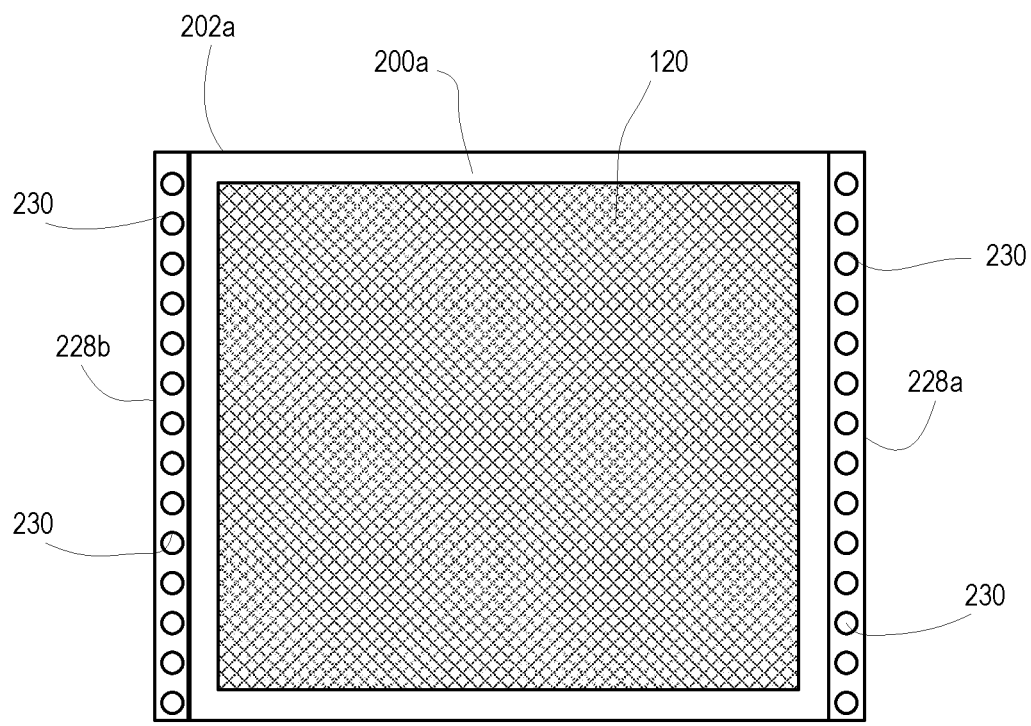
FIG. 2A is a front view of an example air filtration panel that is laterally pre-sized and has peripheral surfaces for attaching to the rack of FIG. 1B, according to one or more embodiments.

FIG. 2A depicts a front view of example air filtration panel 202a that is laterally pre-sized and has right and left peripheral fastener surfaces 228a-228b having through-holes 230 for attaching to rack 106 (FIG. 1B). Air filtration panel 202a includes filter frame 200a attached around air filter 120. Filter frame 200a is narrow, allowing substantially unimpeded air flow through air filter 120. Air filtration panel 202a can be a single use item that is removed and replaced when air filter 120 reaches filtering capacity.

Figure 2B:
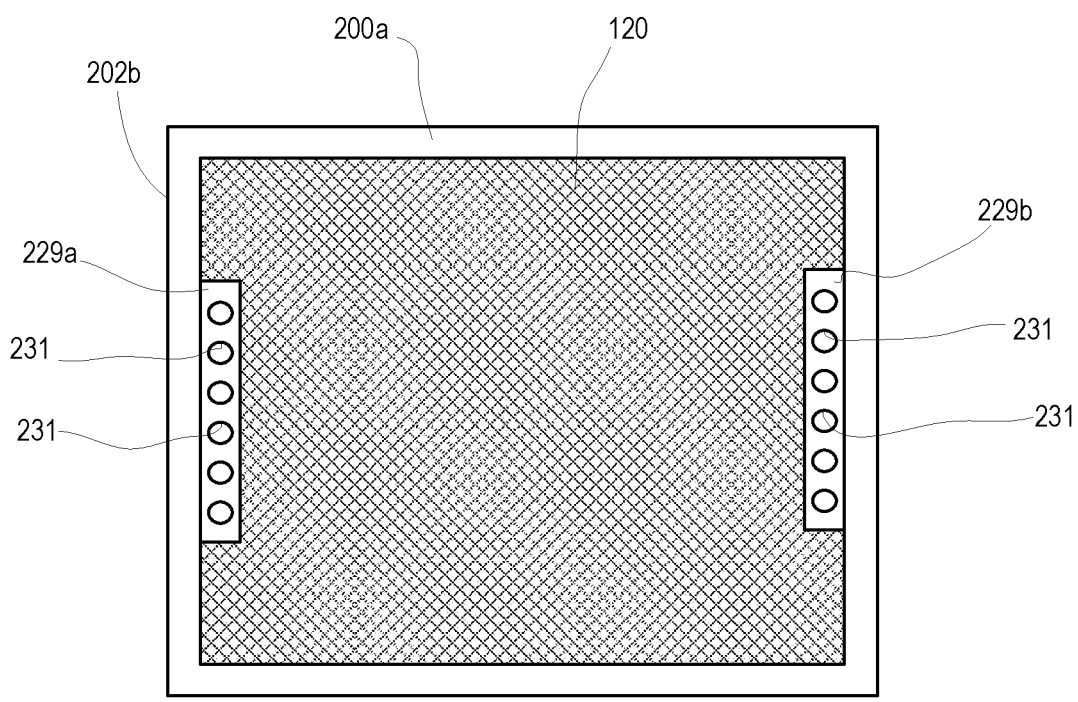
FIG. 2B is a front view of an example air filtration panel that is laterally pre-sized and has inward surfaces for attaching to the rack of FIG. 1B through an air filter, according to one or more embodiments.

FIG. 2B depicts a front view of example air filtration panel 202b that includes filter frame 200a attached around air filter 120. Air filtration panel 202b is laterally pre-sized and has right and left inward fastener surfaces 229a-229b attached to filter frame 200b and having through-holes 231 for attaching to rack 106 (FIG. 1B) from a front face of air filter 120. In one or more embodiments, through-holes 231 are covered by a frangible or punch out surface that blocks air flow if not used with a fastener. Air filtration panel 202b can be a single use item that is removed and replaced when air filter 120 reaches filtering capacity.

Figure 3:
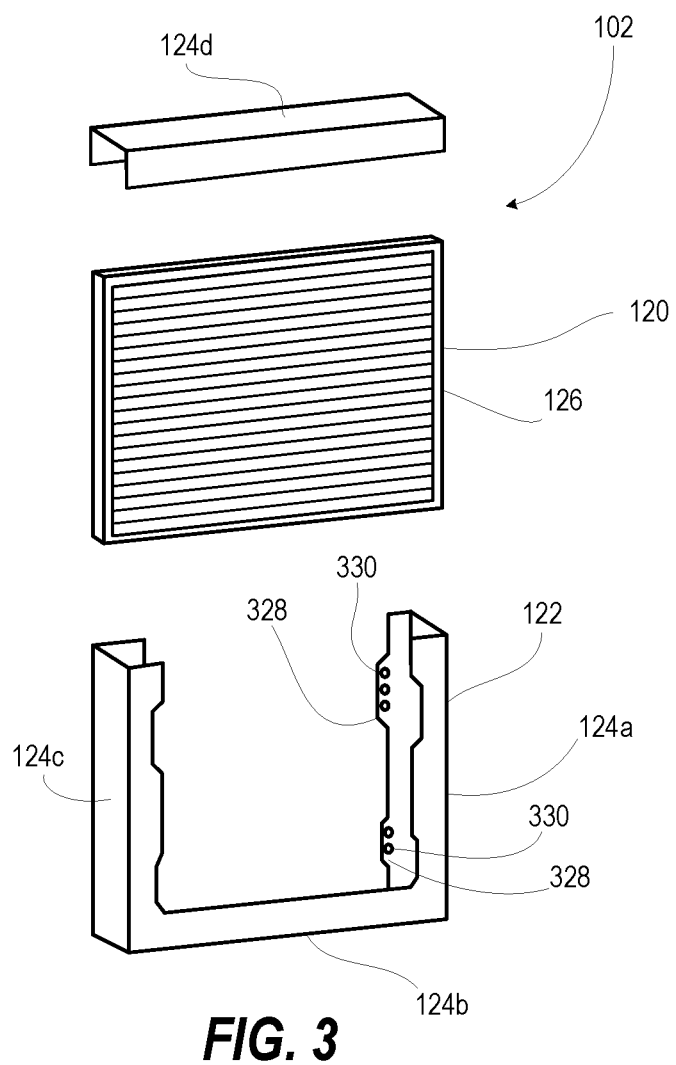
FIG. 3 is a three-dimensional disassembled view of the example air filtration panel with a replaceable air filter, according to one or more embodiments.

FIG. 3 depicts a three-dimensional, disassembled view of example air filtration panel 102 with replaceable air filter 120. Filter frame 122 has right, left and bottom U-shaped channels 124a-124c that are open toward the interior to receive and to contain outer edges 126 of air filter 120. Top U-shaped channel 124d is removable to allow positioning of air filter 120 into the lower and side channels 124a-124c. When attached, top U-shaped channel 124d contains a top outer edge 126 of air filter 120. In one or more alternate embodiments, a top portion of a filter frame has a slot (not shown) that is sized to receive air filter 120. Filter frame 122 includes fastener surfaces 328 having through-holes 330 that are spaced to engage to flanges 116a-116b of rack 106 (FIG. 1A).

Figure 4A:
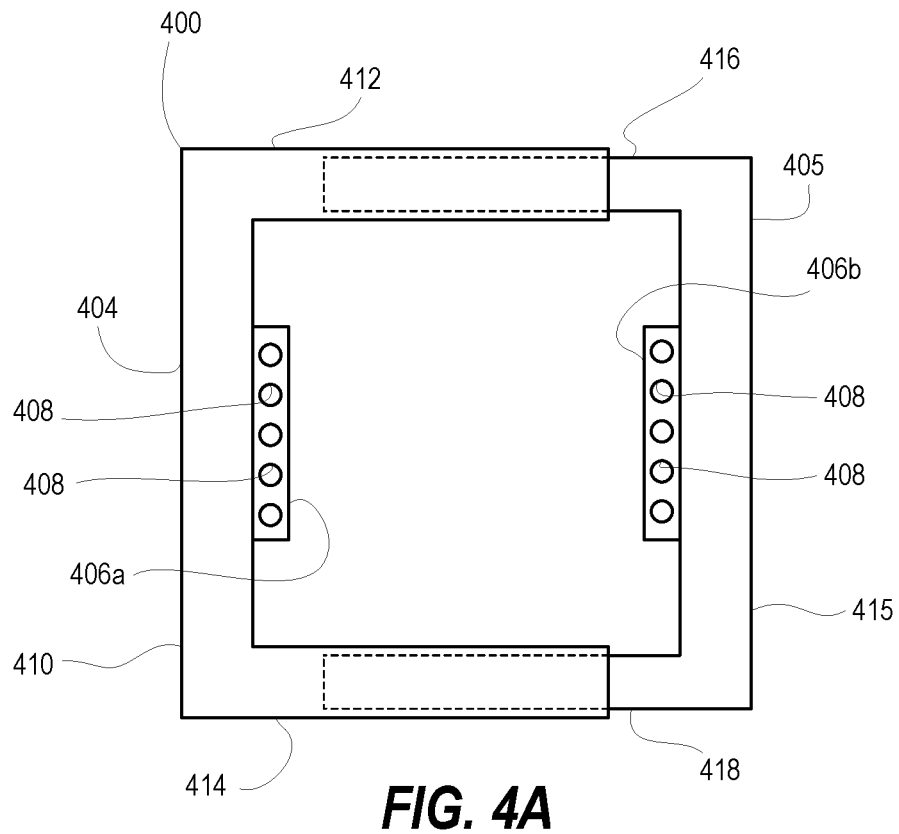
FIG. 4A is a front view of an example filter frame of an air filtration panel that is laterally adjusted to a first size, according to one or more embodiments.

FIG. 4A depicts a front view of example filter frame 400 of air filtration panels 102a, 102b (FIG. 1A) that is vertically and laterally adjusted to a first size. First U-shaped section 404 is positioned at a left side of filter frame 400 as depicted. Fastener surface 406a with through-holes 408 extends inwardly along a left side for mounting to left side flanges 116b of rack 106 (FIG. 1B). Second U-shaped section 405 is positioned on a right side as depicted. Fastener surface 406b with through-holes 408 extends inwardly along a right side for mounting to right side flanges 116a-116b of rack 106 (FIG. 1A). Filter frame 400 laterally telescopes in size to match the width of rack 106 (FIG. 1A). First U-shaped section 404 includes vertical member 410 attached at the top to a horizontal upper receiving member 412 and attached at the bottom to a horizontal lower receiving member 414. Inner U-shaped section 405 includes vertical member 415 attached at the top to a horizontal upper engaging member 416 and attached at the bottom to a horizontal lower engaging member 418. Upper engaging member 416 and lower engaging member 418 of inner U-shaped section 405 horizontally translates respectively into upper receiving member 412 and lower receiving member 414 of first U-shaped section 404 to a first width. As referenced herein, "attached" can include separately fabricated components that are adhered, fastened, engaged, or welded together. In addition, "attached" can mean a unitary fabrication with identified components formed from the same piece of material. The attachment between identified components can include an intermediate component that locks the two identified components together.

Figure 4B:
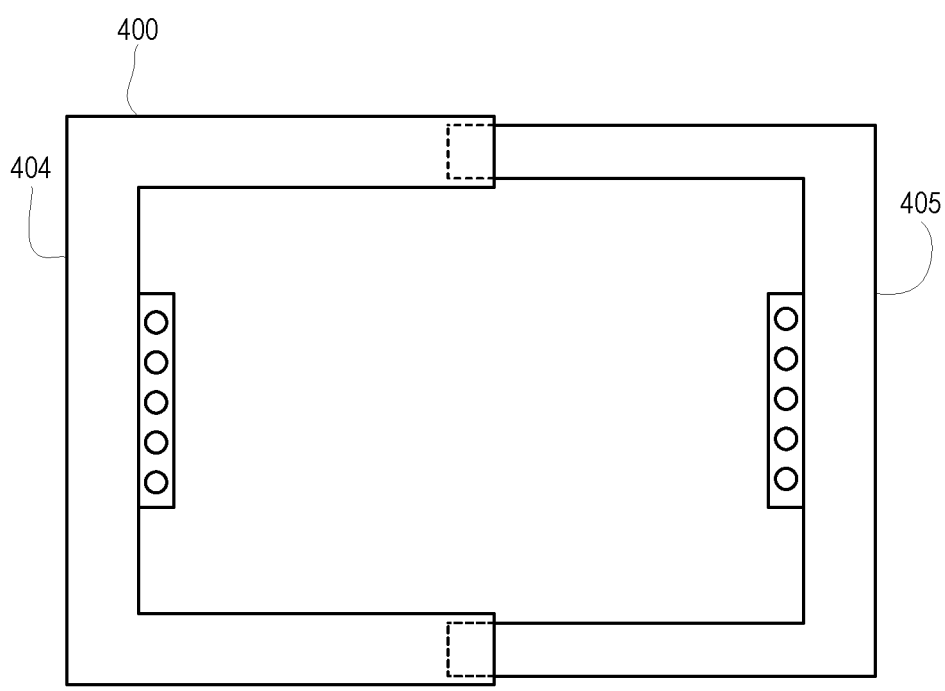
FIG. 4B is a front view of the example filter frame that is laterally adjusted to a second size that is wider than the first size, according to one or more embodiments.

FIG. 4B depicts a front view of filter frame 400 that is laterally adjusted to a second width that is wider than the first width of FIG. 4A. An inserted amount of upper and lower engaging members 416, 418 is greater in FIG. 4A than in FIG. 4B. In one or more embodiments, the lateral size can be maintained by interference fit between outer and inner U-shaped sections 404, 405. An interference fit, also known as a press fit or friction fit is a fastening between two parts which is achieved by friction after the parts are pushed together, rather than by any other means of fastening. In one or more embodiments, the lateral size can be maintained by fasteners or locking mechanisms engaged between outer and inner U-shaped sections 404, 405. In one or more embodiments, the lateral size can be maintained by applying adhesive between outer and inner U-shaped sections 404, 405.

Figure 5A:
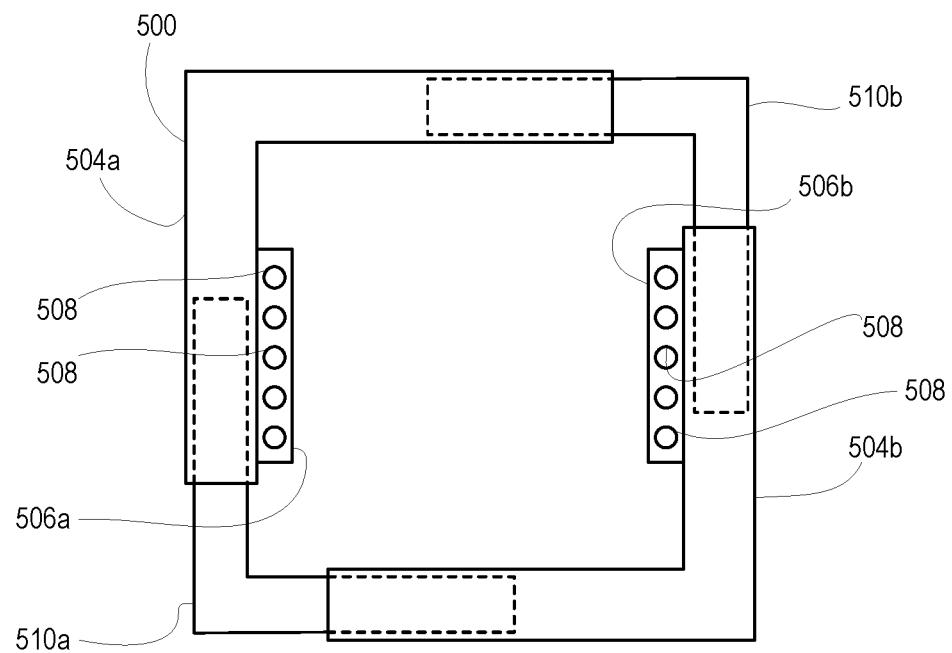
FIG. 5A is a front view of an example filter frame of an air filtration panel that is vertically and laterally adjusted to a first size, according to one or more embodiments.

FIG. 5A depicts a front view of example filter frame 500 for air filtration panels 102a, 102b (FIG. 1A) that is vertically and laterally adjusted to a first size using four (4) L-shaped corner sections 504a, 504b, 510a, 510b. First L-shaped corner section 504a is positioned at an upper left corner of filter frame 500 as depicted. In one or more embodiments, fastener surface 506a with through-holes 508 extends inwardly along a left vertical side for mounting to flanges 116a-116b of rack 106 (FIG. 1A). Second L-shaped corner section 504b is identical to first L-shaped corner section 504a but rotated 180° and positioned at a lower right corner as depicted. In one or more embodiments, fastener surface 506b with through-holes 508 extends inwardly along a right vertical side for mounting to flanges 116a-116b of rack 106 (FIG. 1A). Third L-shaped corner section 510a is position at a lower left corner as depicted, with both ends inserted into adjacent ends of first and second L-shaped corner sections 504a-504b. Fourth L-shaped corner section 510b is position at an upper right corner as depicted, with both ends inserted into adjacent ends of first and second L-shaped corner sections 504a-504b.

Figure 5B:
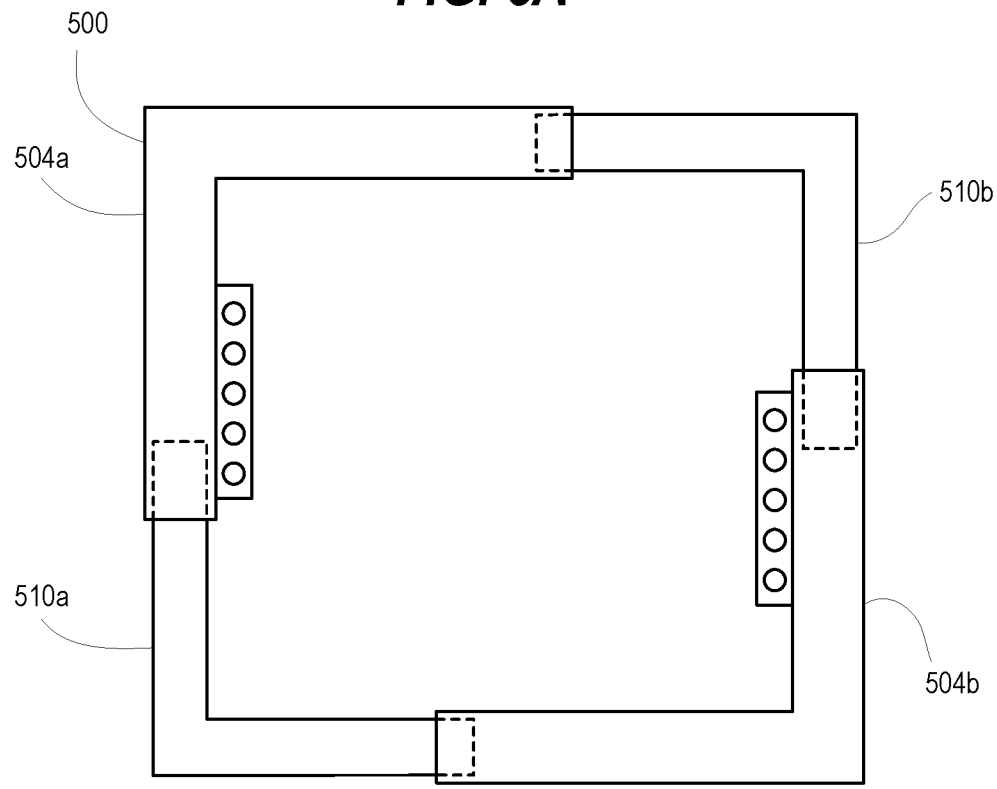
FIG. 5B is a front view of the example filter frame that is vertically and laterally adjusted to a second size that is larger than the first size, according to one or more embodiments.

FIG. 5B depicts a front view of example filter frame 500 that is vertically and laterally adjusted to a second size that is larger than the first size. Vertical and lateral adjustments can be independently made to match a width and a height of rack 106 (FIG. 1A). The amount of insertion of the ends of first and second inner L-shaped corner sections 510a-510b into first and second L-shaped corner sections 504a-504b provides the size adjustment. In particular, lateral width is adjusted by first inner L-shaped corner section 510a translating within second L-shaped corner section 504b and second inner L-shaped corner section 510b translating within first L-shaped corner section 504a. The vertical height is adjusted by first inner L-shaped corner section 510a translating within first L-shaped corner section 504a and 510b translating within second L-shaped corner section 504b. The open space between the opposed posts extending along the entire height of rack 106 (FIG. 1A) can be covered by one or more filter frames 500. The adjustment can be maintained by interference fit, fasteners, locking mechanisms, or adhesives. In one or more embodiments, mounting to rack 106 (FIG. 1A) secures the adjusted size of filter frame 500.

Figure 6:
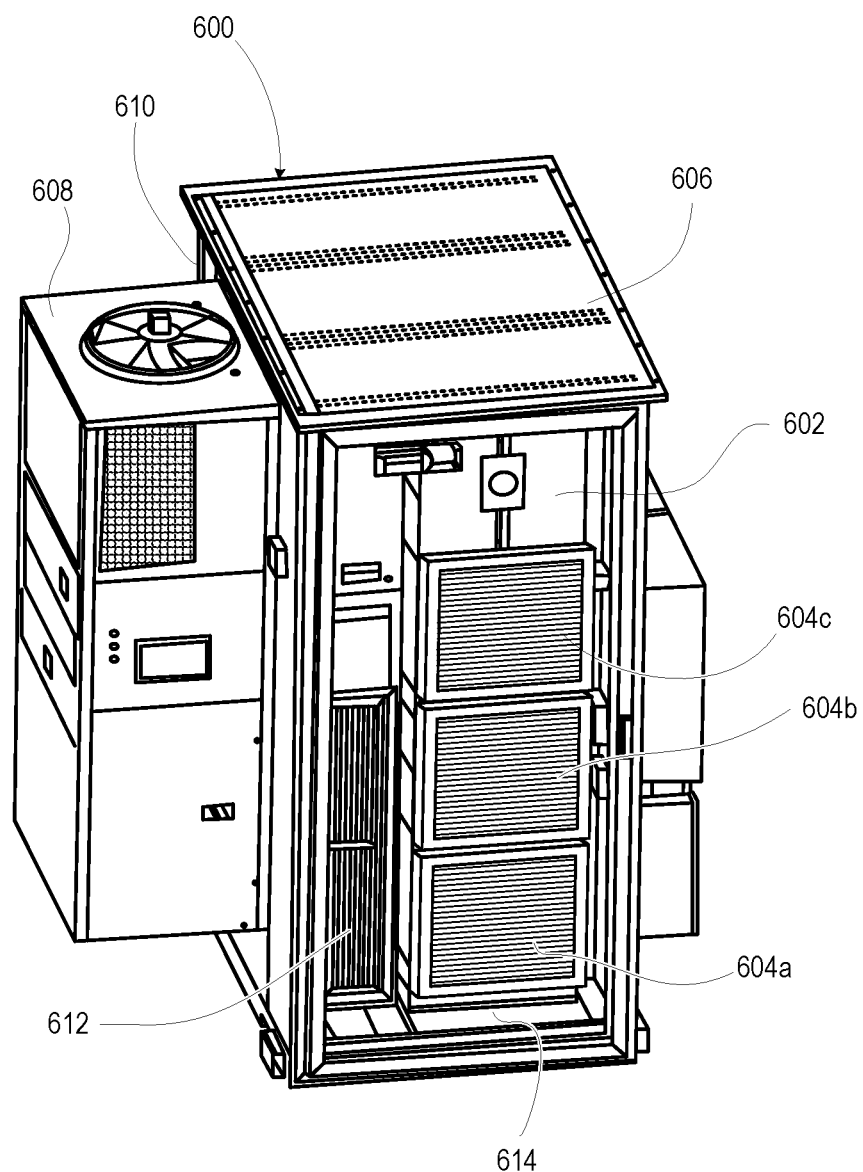
FIG. 6 is a three-dimensional top left view of an example modular data center (MDC) having a cold aisle side of an RIHS protected by three air filtration panels, according to one or more embodiments.

FIG. 6 depicts a three-dimensional top left view of example modular data center (MDC) 600 having a cold aisle side of RIHS 602 protected by three air filtration panels 604a-604c, particularly for situations when volumetric container 606 is open to outside air. A data center houses IHSs and associated components, such as telecommunications and storage systems. MDC 600 is a deployable data center. MDC 600 can be placed in locations where data capacity is needed. MDC 600 consist of purpose-engineered modules and components that offer scalable data center capacity with multiple power and cooling options. Modular edge data centers (MEDCs) are generally smaller MDC facilities that extend the edge of the network to deliver cloud computing resources and cached streaming content to local end users. MEDCs that have only one or two racks for IT are also referred to as micro MDCs. Minimizing a footprint of an MEDC, and especially for a micro MDC, enables use in space-constrained applications. Cooling unit 608 is mounted to rear external wall 610 and directs air internally through volumetric container 606 via air redirection structure 612. Supply air is directed to cold aisle 614.

Figure 7:
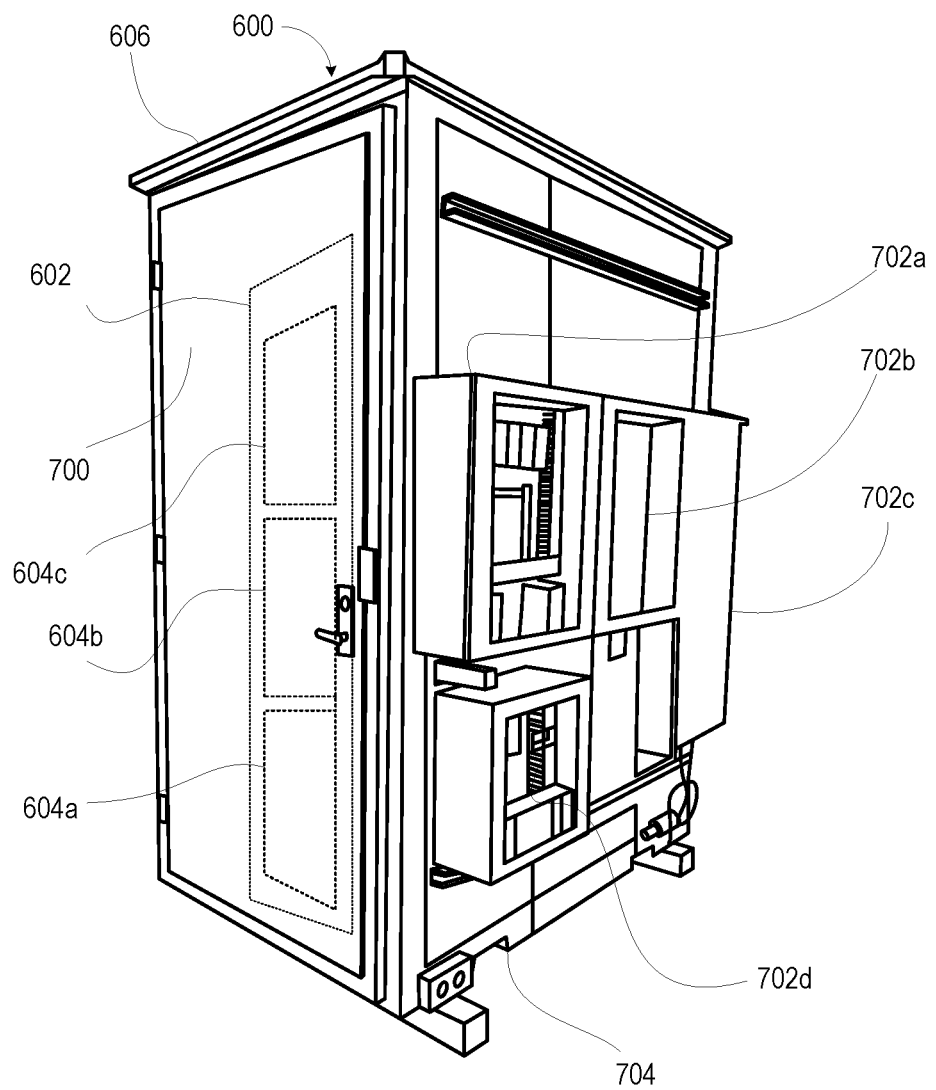
FIG. 7 is a perspective left front view of the example MDC of FIG. 6 with a left access door closed enclosing the air filtration panels, according to one or more embodiments.

FIG. 7 depicts a perspective left front view of example MDC 600 with left access door 700 closed enclosing RIHS 602 and air filtration panels 604a-604c. Normal operation direct cooling air through air filtration panels 604a-604c to remove contaminants that have entered volumetric container 606 such as through cooling unit 608 (FIG. 6). External enclosures 702a-702d provide access, respectively, to certain components of controls, security, power, and network subsystems without having to open left access door 700. Volumetric container 606 includes a palletized base 704 for delivering and positioning MDC 600 using a forklift vehicle.

Figure 8:
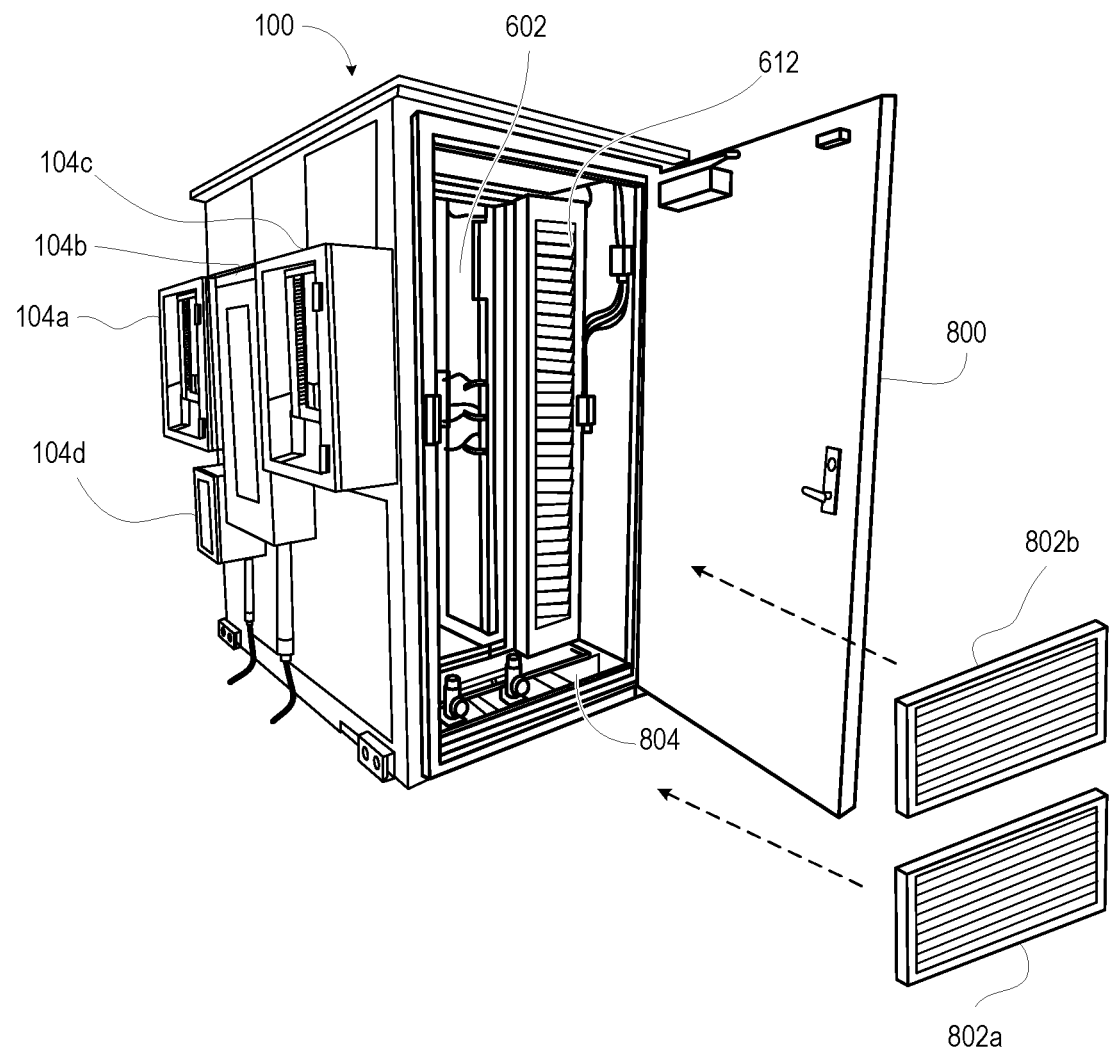
FIG. 8 is a perspective right front view of the example MDC of FIG. 6 with a right access door opened to a hot aisle side of the RIHS for adding air filtration panels, according to one or more embodiments.

FIG. 8 depicts a perspective right front view of example MDC 600 with right access door 800 opened to a hot aisle side of RIHS 602. In the presented embodiment, air filtration panels 802a-802b are added to the hot aisle side of rack posts to prevent contaminants from outside air from back flowing through RIHS 602. In one or more embodiments, air filtration panels 802a-802b have a lateral width to also prevent contaminates from reaching air redirection structure 612 that draws return air from hot aisle 804 back to cooling unit 608 (FIG. 6).

Figure 9:
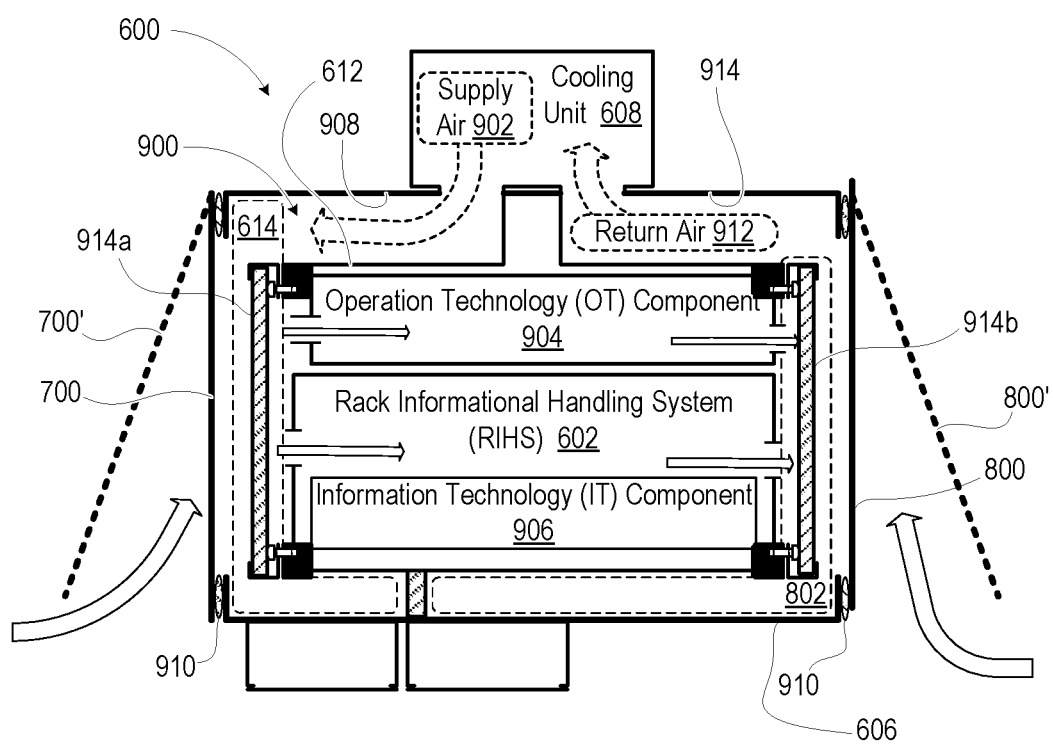
FIG. 9 is a top diagrammatic view of air flow patterns in the example MDC of FIG. 8 with air filtration provided by air filtration panels for the RIHS, according to one or more embodiments.

FIG. 9 depicts a top diagrammatic view of air flow patterns 900 in example MDC 600 with left and right access doors in a closed position 700, 800 and in an open position 700', 800' respectively. Cooling unit 608, which is exteriorly coupled to volumetric container 606, provides supply air 902. Cooling unit 608 can prepare supply air 902, which can include recirculated air, outside air, or mixed air. Cooling unit 608 warms, cools, dehumidifies, or humidifies the air, as required for operation technology (OT) components 904 and information technology (IT) components 906. For example, cooling unit 608 can cool air using direct evaporative cooling or mechanical cooling. Pressurized supply air 902 is directed by supply air plenum 908 of air redirection structure 612 to cold aisle 614. During normal operation, left and right access doors 700, 800 are sealed with door seals 910 to prevent loss of cooling air. Cooling unit 608 draws return air 912 from hot aisle 804, directed by return air plenum 914 of air redirection structure 612, creating a lower pressure within hot aisle 802 than cold aisle 614. In response to the pressure differential, cooling air is passively drawn through air passages in OT components 904 and RIHS 602. Cooling air is filtered by air filtration panel(s) 914a, 914b on both cold aisle and hot aisle sides. When either of left and right access door 700', 800' is open, air filtration panel(s) 914a, 914b respectively protect MDC 600 from outside air contaminants and particulates.

Figure 10:
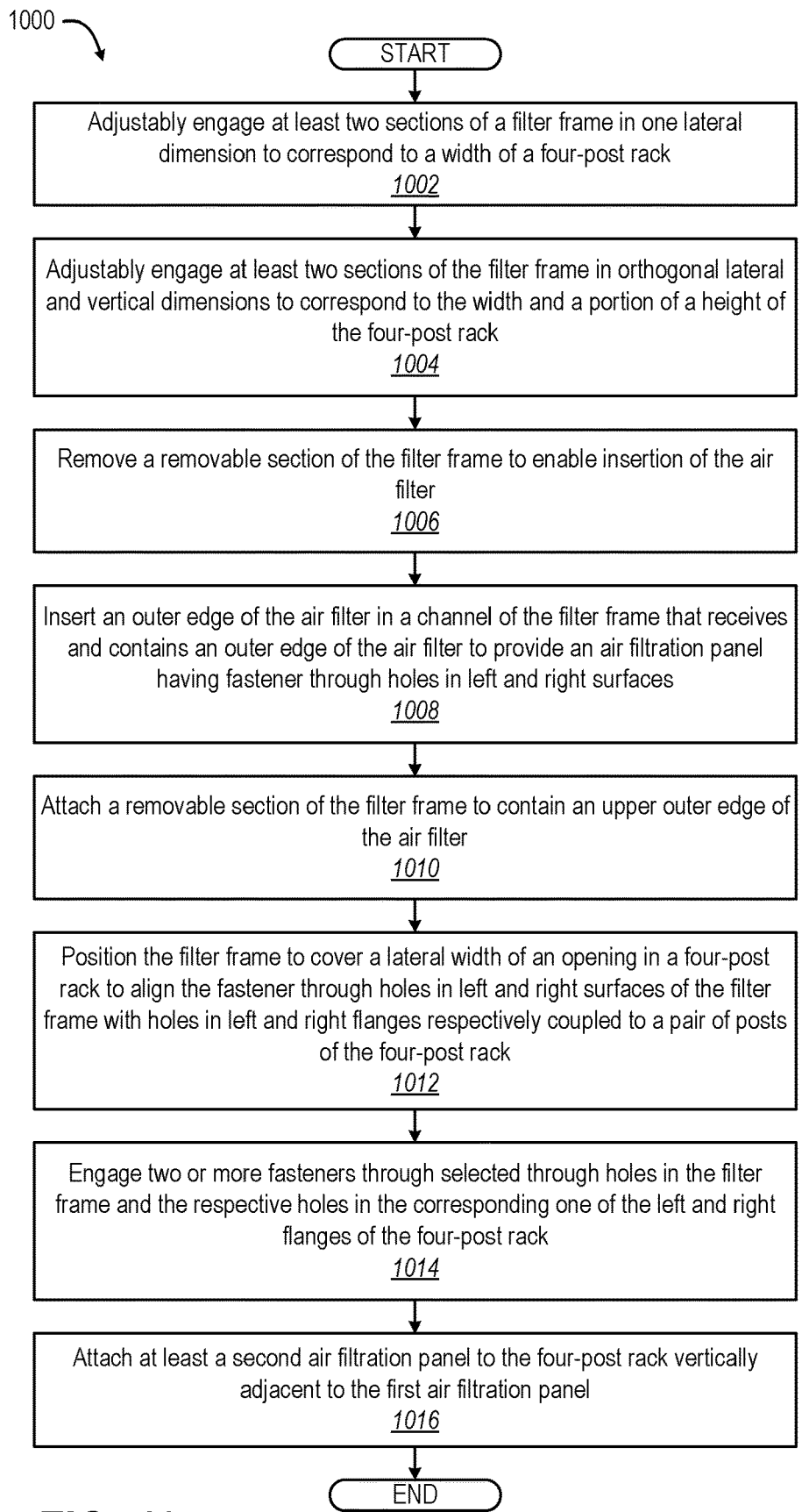
FIG. 10 is a flow diagram of a method of protecting information technology (IT) equipment from contaminated outside air in an MDC, according to one or more embodiments.

FIG. 10 depicts a flow diagram of method 1000 of protecting IT equipment from contaminated outside air. The description of method 1000 is provided with general reference to the specific components illustrated within the preceding FIGS. 1-9. In at least one embodiment, method 1000 can be implemented using an automated manufacturing system under control of an information handling system (IHS) such as RIHS 602 (FIG. 6). In one or more embodiments, method 1000 includes adjustably engaging at least two sections of a filter frame in one lateral dimension to correspond to a width of a four-post rack (block 1002). In one or more embodiments, method 1000 includes adjustably engaging at least two sections of the filter frame in orthogonal lateral and vertical dimensions to correspond to the width and a portion of a height of the four-post rack (block 1004). In one or more embodiments, method 1000 includes removing a removable section of the filter frame to enable insertion of the air filter (block 1006). Method 1000 includes inserting an outer edge of the air filter in a channel of the filter frame that receives and contains an outer edge of the air filter to provide an air filtration panel, the filter frame having fastener through-holes in left and right surfaces (block 1008). Method 1000 includes attaching a removable section of the filter frame to contain an upper outer edge of the air filter (block 1010). Method 1000 includes positioning the filter frame to cover a lateral width of an opening in a four-post rack to align the fastener through-holes in left and right surfaces of the filter frame with holes in left and right flanges respectively coupled to a pair of posts of the four-post rack (block 1012). Method 1000 includes engaging two or more fasteners through selected through-holes in the filter frame and the respective holes in the corresponding one of the left and right flanges of the four-post rack (block 1014). In one or more embodiments, method 1000 includes attaching at least a second air filtration panel to the four-post rack vertically adjacent to the first air filtration panel (block 1016). Then method 1000 ends.

In one or more embodiments, the air filter covers the surfaces of the filter frame. Method 100 includes inserting the air filter into the filter frame after mounting the filter frame on the rack. In one or more embodiments, the surfaces with through-holes are peripherally accessible or accessible through the air filter, enabling mounting of the air filtration panel with the air filter installed.

In the above described flow chart, one or more of the methods may be embodied in a computer readable medium containing computer readable code such that a series of functional processes are performed when the computer readable code is executed on a computing device. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. Computer program code for carrying out operations for aspects of the present disclosure may be written in any combination of one or more programming languages, including an object oriented programming language, without limitation. These computer program instructions may be provided to a processor of a general purpose computer, special purpose computer, such as a service processor, or other programmable data processing apparatus to produce a machine, such that the instructions, which execute via the processor of the computer or other programmable data processing apparatus, performs the method for implementing the functions/acts specified in the flowchart and/or block diagram block or blocks.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

As will be further appreciated, the processes in embodiments of the present disclosure may be implemented using any combination of software, firmware or hardware. Accordingly, aspects of the present disclosure may take the form of an entirely hardware embodiment or an embodiment combining software (including firmware, resident software, micro-code, etc.) and hardware aspects that may all generally be referred to herein as a "circuit," "module," or "system." Furthermore, aspects of the present disclosure may take the form of a computer program product embodied in one or more computer readable storage device(s) having computer readable program code embodied thereon. Any combination of one or more computer readable storage device(s) may be utilized. The computer readable storage device may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage device would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible medium that can contain, or store a program for use by or in connection with an instruction execution system, apparatus, or device.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. An air filtration panel for use with an information handling system (IHS) rack within a container enclosing the IHS rack, the air filtration panel comprising:
  an air filter; and
  a filter frame having a lateral width at least as wide as a transverse opening in a four-post IHS rack used to house rack-mounted information technology (IT) equipment and which has left and right vertical flanges respectively coupled to a pair of posts of the four-post rack, each of the left and right vertical flanges having vertically aligned holes, the filter frame comprising:
    a channel that receives and contains an outer edge of the air filter; and
    left and right vertical surfaces each having fastener through-holes spaced to align with and mount to respective vertically aligned holes in the corresponding one of the left and right vertical flanges of the four-post IHS rack.

2. The air filtration panel of claim 1, wherein the filter frame comprises a removable section that allows insertion and replacement of the air filter.

3. The air filtration panel of claim 1, wherein the air filtration panel comprises at least two sections that adjustably engage in one lateral dimension to correspond to a width of the four-post IHS rack.

4. The air filtration panel of claim 3, wherein the at least two sections comprise first and second telescoping portions that adjustably engage.

5. The air filtration panel of claim 1, wherein the filter frame comprises four L-shaped corner sections that adjustably engage in orthogonal lateral and vertical dimensions to correspond to the width and a portion of a height of the four-post IHS rack.

6. A data center comprising:
  a volumetric container having a cold aisle and a hot aisle and having an access door that opens to expose an interior of the volumetric container to outside air;
  at least one four-post rack received in the volumetric container between the cold aisle and the hot aisle, the four-post rack having a rack frame with a front pair of vertical posts and a back pair of vertical posts, the front pair of vertical posts positioned adjacent to the cold aisle and the back pair of vertical posts positioned adjacent to the hot aisle, each pair of vertical posts having left and right flanges respectively with more than one hole that are vertically aligned in a corresponding flange and horizontally aligned with a corresponding hole in another flange;
  a cooling system that directs supply air to the cold aisle and that receives return air from the hot aisle;
  at least one heat generating component positioned in the at least one four-post rack and that receives supply air that is warmed to become the return air; and
  a first air filtration panel comprising:
    an air filter; and
    a filter frame having a lateral width at least as wide as a transverse opening in the four-post rack, the filter frame comprising:
      an inwardly open channel that receives and contains outer edges of the air filter; and
      left and right surfaces each having fastener through-holes spaced to align with and mount to respective holes in the corresponding one of the left and right flanges of the four-post rack.

7. The data center of claim 6, wherein the filter frame of the first air filtration panel comprises a removable section that allows insertion and replacement of the air filter.

8. The data center of claim 6, wherein the filter frame of the first air filtration panel comprises at least two telescoping sections that adjustably engage in one lateral dimension to correspond to a width of the four-post rack.

9. The data center of claim 8, wherein the air filtration panel comprises four L-shaped corner sections that adjustably engage in orthogonal lateral and vertical dimensions to correspond to the width and a portion of a height of the four-post rack.

10. The data center of claim 6, further comprising at least a second air filtration panel attached to the four-post rack vertically above or below the first air filtration panel.

11. The data center of claim 6, wherein the volumetric container is a micro modular data center (MDC) volumetric container sized to fit a selected configuration of: (i) one four-post rack that contains the at least one mounted heating generating component; and (ii) two four-post racks that contain the at least one mounted heat generating component.

12. A method of protecting information technology (IT) equipment within a modular data center (MDC) from contaminated outside air, the method comprising:
  positioning a filter frame of an air filtration panel to cover a lateral width of an opening in a four-post information handling system (IHS) rack containing the IT equipment to align fastener through-holes in left and right surfaces of the filter frame with vertically aligned holes in left and right vertical flanges respectively of a pair of posts of the four-post rack, the four post rack located inside of a volumetric container of the MDC and comprises a pair of front posts within a cold aisle of the MDC and a pair of rear posts within a hot aisle of the MDC; and
  engaging two or more fasteners through selected through-holes in the filter frame and respective vertically aligned holes in the corresponding one of the left and right vertical flanges of the four-post rack.

13. The method of claim 12, further comprising inserting an outer edge of the air filter in a channel of the filter frame that receives and contains an outer edge of the air filter to provide the air filtration panel.

14. The method of claim 13, further comprising removing a removable section of the filter frame to enable insertion of the air filter.

15. The method of claim 12, further comprising adjustably engaging at least two sections of the filter frame in one lateral dimension to correspond to a width of the four-post rack.

16. The method of claim 15, wherein the filter frame comprises four L-shaped corner sections, the method further comprising adjustably engaging at least two sections of the filter frame in orthogonal lateral and vertical dimensions to correspond to the width and a portion of a height of the four-post rack.

17. The method of claim 12, further comprising attaching at least a second air filtration panel to the four-post rack vertically above or below the first air filtration panel.

18. The data center of claim 6, wherein the first air filtration panel is positioned across the front posts of the rack in the cold aisle, the data center further comprising:

a second air filtration panel that is positioned across the back pair of vertical posts at the hot aisle of the volumetric container to prevent contaminants from outside air from back flowing through the at least one heat generating electronic component.

19. The data center of claim 18, wherein the second air filtration panel has a lateral width that prevents contaminates from reaching an air redirection structure of the cooling system.

20. The method of claim 12, wherein the air filter frame of the air filtration panel is positioned across front posts of the four-post rack in the cold aisle, the method further comprising:

positioning a second air filtration panel across a back pair of vertical posts of the four-post rack at the hot aisle of the volumetric container to prevent contaminants from outside air from back flowing through the IT equipment; and engaging two or more fasteners through selected through-holes in a filter frame of the second air filtration panel and the respective holes in the corresponding one of left and right flanges of the back pair of vertical posts.

\* \* \* \* \*